United States Patent [19]

Kadija

[11] Patent Number: 5,167,747
[45] Date of Patent: Dec. 1, 1992

[54] APPARATUS FOR MANUFACTURING INTERCONNECTS WITH FINE LINES AND FINE SPACING

[76] Inventor: Igor V. Kadija, 118 Sherwood Rd., Ridgewood, N.J. 07450

[21] Appl. No.: 701,730

[22] Filed: May 17, 1991

Related U.S. Application Data

[60] Continuation-in-part of Ser. No. 688,257, Apr. 22, 1991, Pat. No. 5,114,558, which is a division of Ser. No. 311,212, Feb. 15, 1989, Pat. No. 5,024,735.

[51] Int. Cl.$^5$ .................. B44C 1/22; C23F 1/00
[52] U.S. Cl. .................. 156/345; 156/634; 156/645; 156/656; 156/902; 156/659.1
[58] Field of Search .............. 156/345, 634, 640, 636, 156/645, 637, 654, 901, 659.1, 902, 656; 204/129.46, 129.65, 129.7, 224 R

[56] References Cited

U.S. PATENT DOCUMENTS

| | | | |
|---|---|---|---|
| 2,446,443 | 8/1948 | Tibbetts | 156/345 |
| 2,968,056 | 1/1961 | Aveni | 156/345 X |
| 3,411,973 | 11/1968 | Siler | 156/345 |
| 3,549,439 | 12/1970 | Kaveggia et al. | 156/345 X |
| 4,376,009 | 3/1983 | Kunz | 156/345 X |
| 4,451,327 | 3/1984 | Nelson | 156/345 X |
| 5,024,735 | 6/1991 | Kadija | 156/636 X |

FOREIGN PATENT DOCUMENTS 2040643 2/1972 Fed. Rep. of Germany .
57-135049 8/1982 Japan .
57-285234 11/1982 Japan .
58-206541 12/1983 Japan .
2083023 3/1982 United Kingdom .

OTHER PUBLICATIONS

J. Chem. Soc., (1929), pp. 1870–1873 (Chem. Abs., vol. 24, p. 77).
J. Chem. Soc. (1927), pp. 1113–1122.
WO 90/09976 International Publication (PCT Application PCT/US 90/01081).
Zh. Org. Khim (1971), vol. 7, part 12, pp. 2567–2569 (Chem. Abs. 76 72171Y).

Primary Examiner—William A. Powell
Attorney, Agent, or Firm—Kenyon & Kenyon

[57] ABSTRACT

An apparatus for producing fine line printed circuits, with fine spacing between lines, includes a pad structure which can be vibratedly moved across the surface of a laminate to be etched. Etchant solution is provided in a uniform manner across the face of the pad structure as a result of the combination of the layout of the face of the pad, the support materials, and the orientation of an etchant distribution system.

8 Claims, 10 Drawing Sheets

A- FEED GROOVES AND TUBES
B,C- DRAIN SYSTEM

APPARATUS FOR MANUFACTURING INTERCONNECTS WITH FINE LINES AND FINE SPACING

RELATED APPLICATIONS

This application is a continuation-in-part of U.S. Ser. No. 688,257, entitled METHOD AND APPARATUS FOR MANUFACTURING INTERCONNECTS WITH FINE LINES AND SPACING filed on Apr. 22, 1991, now U.S. Pat. No. 5,114,558, which is a division of U.S. Ser. No. 311,212 entitled METHOD AND APPARATUS FOR MANUFACTURING INTERCONNECTS WITH FINE LINES AND SPACING, filed on Feb. 15, 1989, now U.S. Pat. No. 5,024,735.

FIELD OF THE INVENTION

This invention relates to methods and apparatus for fabrication of fine line and fine space interconnections in electronic packaging. The present invention is particularly applicable for printed circuit boards (PCBs), tape automated bonding (TAB) systems and other electronic devices with the need for fine line and space interconnects.

The technical content of PCBs are based on three aspects: density of the electronic circuitry, number of layers, and the quality of material used in lamination of the boards. The present invention relates to the first aspect, the circuit density of the board.

Circuit density is determined by the relative proximity on the board of the electrically active elements and their number per unit area of the board. The elements that constitute the majority of electrical elements on the board are copper conductor lines. Hence, the density of the PCB is dependent upon the lateral spacing of the conductor lines and their width.

DESCRIPTION OF THE RELATED ART

The trend towards finer lines and decreasing interline spacing has been strong in recent years, and will continue into the future. There have been several articles on this subject. In the article "Shrinking Semiconductors", *PC Fabrication*, May 1988, R. W. Allison, Jr. et al. state that "a steadily decreasing IC line width increases the number of connections to be made on package/board interface. These require an increase in PCB line density and the number of layers in the board." In concurrence with the great majority of authorities in the field they conclude that PCBs with 2 mil lines will become the standard in the industry in the early 1990s.

In the June 1987 edition of *Printed Circuit Fabrication*, Vol. 10, No. 6, at pages 37–44, an article by R. D. Rust, entitled "Fine Line Technology: The Impact of Dry Plasma Processing", discusses dry plasma processes supplanting wet chemical processes for printed circuit fabrication. One of the issues noted by Rust is the need for generation of fine line features of less than four mils. Rust notes that photolithographic resolution is not the limiting process in generating these features. Instead, the subsequent processes of developing, and etching or plating are the limiting processes.

Conventional printed circuit boards are manufactured in the following manner. First, epoxy and copper laminates are joined by heat and pressure. The epoxy laminate is much thicker than the copper laminate and it provides mechanical support for the board. Application of heat and pressure causes the epoxy to soften and bond to the copper laminate. The copper surface is treated either chemically, or electrochemically with dendritic treatment, both of which produce a jagged surface on a microscopic scale, which promotes adhesion.

Photo-resist is then applied on the copper surface. Liquid photo-resist application has recently been replaced by 'dry' photo-resist methods. In the dry photo-resist technique, a photo-resist film is laminated on the copper, also by application of heat and pressure.

The conductor pattern is then 'exposed' on the photo-resist. The exposed board is 'developed' in an appropriate chemical solution that dissolves the photo-resist, consequently exposing the copper surface along the areas which are to be etched in the following 'copper etching' operation.

In the copper etching operation, the developed board is passed through a chemical spray chamber, where jets spray chemicals which dissolve copper. The photo-resist and the copper etching solution have been chosen so that the sprayed chemicals only attack the copper and not the photo-resist. At the conclusion of the copper etching process, a well defined conductor pattern with a overlay of photo-resist is left on the epoxy substrate.

The photo-resist overlay is then etched away by another chemical solution which etches only the photo-resist and not the copper.

In printed wiring board manufacturing involving 'multilayers', i.e., boards containing several layers of alternate copper conductors and epoxy laminates, interconnection between the copper conductors on different levels is necessary. That is accomplished by drilling holes at the appropriate levels and depositing copper in the holes, with a prior treatment which assures adhesion of the deposited copper to the epoxy sidewalls.

This etching technology employs an oxidizing solution, consisting typically of ferric, cupric or persalfate ions, which is sprayed over an imaged laminate. In a subsequent process, copper surfaces protected by an insulating film become part of the circuitry following removal of the film by chemical dissolution.

By the nature of the hydrodynamics of the typical spraying process, the etching solution is unable to penetrate deep into the recesses formed at levels of less than five mils in spacing. Therefore, the exchange of matter is slowed considerably so that the etching process in narrower spaces is so slow that it does not accomplish the necessary copper removal in comparison with wider spacing. This limitation in mass transport is a major limitation in spray chemical etching process.

Two approaches are known in the art to attempt to overcome this problem.

In one of these approaches, the circuitry is made in an additive manner. Negative masking of the substrate leaves openings for the desired circuitry. Bare substrate in these openings is sensitized with a palladium activator such as employed in electroless copper. Activation is followed by growth of the electroless copper to the required thickness in the desired locations.

Transport of matter is a limiting aspect of the additive process in the same manner as in the etching process. Another problem with this technique is a slow rate of line formation. Problems also occur in the mechanical properties and quality of the formed copper.

A second approach for overcoming the shortcomings of the chemical spray process involves electrochemically assisting the chemical etching. In this method, a positive electrical field is applied to the laminate. Electrical contact is typically made at one side or edge of a board on which the upper laminate is disposed. As long as electrical connection is maintained, dissolution occurs both chemically and electrochemically. Problems with this method include resulting electrical discontinuities in the pattern produced.

Derek Pletcher, in his book *Industrial Electrochemistry* (Chapman & Hall, 1982), mentions an electrochemical etching method for making PCBs where the laminated copper, with developed photo-resist that exposes only the area to be etched, is subject to a mixture of graphite particles and sulfuric acid. The graphite particles have been previously charged by being in contact with the anode. This process, however, has not proven to be successful on a commercial scale due to the expensive etching method involving the use of graphite, its recovery, and etching at high concentrations. In addition, this method suffers the standard problems in substrative technology, i.e., that mass transport limitations as well as limitations in the undercutting of the copper with dissolution propagating in all directions with equal rate.

SUMMARY OF THE INVENTION

The above chemical and electrochemical processes have several problems in achieving fine lines and fine spaces due to their inherent non-uniform accessibility to the varying width interstices of the fine line pattern to be formed.

The present invention provides a method and apparatus for providing fine line and fine spacing formations on printed circuit boards and in electronic industry in general. The invention incorporates mechanical means in the form of non-conductive and/or conductive fibers capable of uniformly reaching all sites at the same time. The rate of dissolution in both chemical and electrochemical processes is uniform. Thus, the present invention is believed capable of producing spacings beyond the presently conceived practical limit of 5 mils in printed circuit boards.

U.S. Pat. No. 4,195,923 discloses an electrically conductive brush applicator for plating a workpiece. The present invention is an extension and modification of my patent to enable the use of similar technology for printed circuit board fabrication.

The protrusion of fibers through liquid is both directional and uniform. The invention employs uniform pressure over the entire area to be treated. This results in uniformity of chemical action and of electrical field effect where applied.

In U.S. Pat. No. 4,159,934, a selective plating applicator is shown employing a brush used in the plating applicator. The brush includes an electrical conducting core with a plating brush attached to one end of the core. A plating current is applied to the core and a brush head comprised of anodic electrically conducting flexible fibers and electrically non-conducting flexible fibers is employed. The non-conducting fibers in the brush head are formed such that the conducting fibers will not contact the workpiece, thereby avoiding a shorting out of the equipment and preventing electrodeposition. Various constructions are shown to accomplish this non-contacting function of the conducting fiber.

The delivery of electricity in a uniform manner has thus been demonstrated in U.S. Pat. No. 4,159,934. This method is designed for selective plating of metals. The metal to be plated is electrically connected to the negative pole of a DC supply or voltage. An apparatus which consists of a mixture of electrically conductive wires and nonconductive wires delivers the electricity in a selective manner. The conductive and nonconductive wires are arranged in a manner of bristles in a brush. The conductive wires are shorter in length compared to the nonconductive wires. Both the conductive and nonconductive wires are joined to a common metallic stem. This metallic stem is joined electrically to the positive pole of the DC power supply. The apparatus also has proper facilities to deliver the appropriate electroplating solution to the core of the brush in such a manner that when the nonconductive wires make contact with the metal to be plated, a sufficient amount of electroplating solution becomes available in that area. When the nonconducting wires make physical contact with the metal to be plated, the conducting wires are kept at a distance from the metal, but in physical contact with the electroplating solution so that an electric field can be established. The electrochemical cell formed with the positively charged metal wire from the brush, the electroplating solution and the negatively charged metal, directs the positively charged metal ions from the electroplating solution to the metal. This results in the deposition of the metal on the substrate (metal) to be plated. The total size of the metallic portion of the wire brush then dictates the area where plating deposits are formed. By moving the brush to the location where plating deposits are desired, it is possible to selectively plate the metallic substrate.

A modified concept of the above apparatus is used in a first embodiment of the present invention.

In the first embodiment of the present invention, metallic wires are attached to a hollow, cylindrical, metallic core. The metallic wires or fibers are quite fine in diameter. Space is provided in the cylindrical metallic core in the shape of perforations for the transfer of electrolyte, which is fed from the hollow inner portion of the metallic cylinder, along with metallic fibers, to the copper substrate on the laminated board.

In the method of this first embodiment, the metallic wires or fibers are electrically connected through the metal cylinder to the positive pole (anode) of the DC power source. The metal fibers also make direct contact with the metal to be etched. A perforated or mesh copper is positioned within the hollow cylinder, but separated from the cylinder. The mesh is electrically connected to the negative pole (cathode) of the DC power supply. A cell is now made between the copper laminate and the perforated copper inside the cylinder. Copper from the laminate (anode) is removed and deposited on the perforated copper (cathode). The action is opposite to what is accomplished in the U.S. Pat. No. 4,159,934. The metal fibers of the brush continue to make contact as the metal is grooved since the bristles are conformal in nature. The electricity to the part is turned off when the etching action is complete.

The same apparatus can be used for electroforming applications. In such applications, the fibers can be connected to the negative pole of the rectifier, while an anodically insoluble conductive substrate can be used in place of the counter-electrode within the hollow cylinder. By contacting an activated or metallic substrate with negatively charged fibers one can deposit metal in the exposed areas.

The size of brush and configuration of the different elements of the brush (the fibers, cathode, cylinder size and shape of the perforations on the metallic cylinder) can be varied to suit the size and complexity of the PCB or other fine line and space application. In this method the length of the cylinder can be varied and still deliver electricity locally, due to the fibers distributing the current (field) uniformly across the entire area.

The method may also embody a processing unit in the shape of a flat processing pad. This type of apparatus has an advantage over the above-described cylindrical unit when an area of several hundred square inches must be etched. For example, the pad unit can be applied over the entire area of a PCB simultaneously. Thus, the unit production may be increased while the pattern accuracy is preserved.

The problem of delivering electricity to the right location in a uniform manner thus being resolved in the first embodiment, the mass transfer and hydrodynamics of the solution can be optimized by making minor chemical corrections and controlling the dynamics of liquid. This process extends the limits achieved today by the most advanced previously known production methods in the industry.

According to a second embodiment of the present invention similar advantageous etching characteristics can be obtained providing simply a chemical etching process, without need of conductive fibers. In this second embodiment, a flat brush, with specified surface configuration and with a uniform application of etchant between the pad and the surface of the board, along with the application of uniform pressure and the provision of a minimal brushing motion, also produces fine line-fine and fine spaced circuit lines on the substrate.

In this second embodiment the flat brush is constituted by a processing pad that may be a polypropylene material as a substrate with a polyester cloth attached to the substrate as a face of the brush in a quilted structure.

Additionally, this second embodiment can be used as a pad for either vertical processing of boards or horizontal processing of boards. Furthermore, etchant distribution systems are provided in connection with the processing pad to assure a uniform distribution of etchant between the surface of the board and the processing pad.

The process has several other advantages. In fine line and space PCB manufacturing it utilizes all the equipment that is needed for the subtractive process, up to the etching process. The chemicals used for this process are those used commercially, and thus are comparable in cost to those used in conventional subtractive methods. No extra masking steps are required. No special solution recovery system is required. The speed of execution of the technique is comparable to the conventional subtractive etching methods. In addition, the process is applicable in instances when electroforming (additive) techniques may be advantageous.

Other examples of potential applications are tape automated bonding (TAB) systems and hybrid IC circuitry, both with fine line and space requirement.

BRIEF DESCRIPTION OF THE DRAWINGS

These as well as further objects and advantages of the invention will become apparent to those skilled in the art from a review of the following detailed description with reference being made to the accompanying drawings in which.

DETAILED DESCRIPTION OF THE INVENTION

Figure 1:
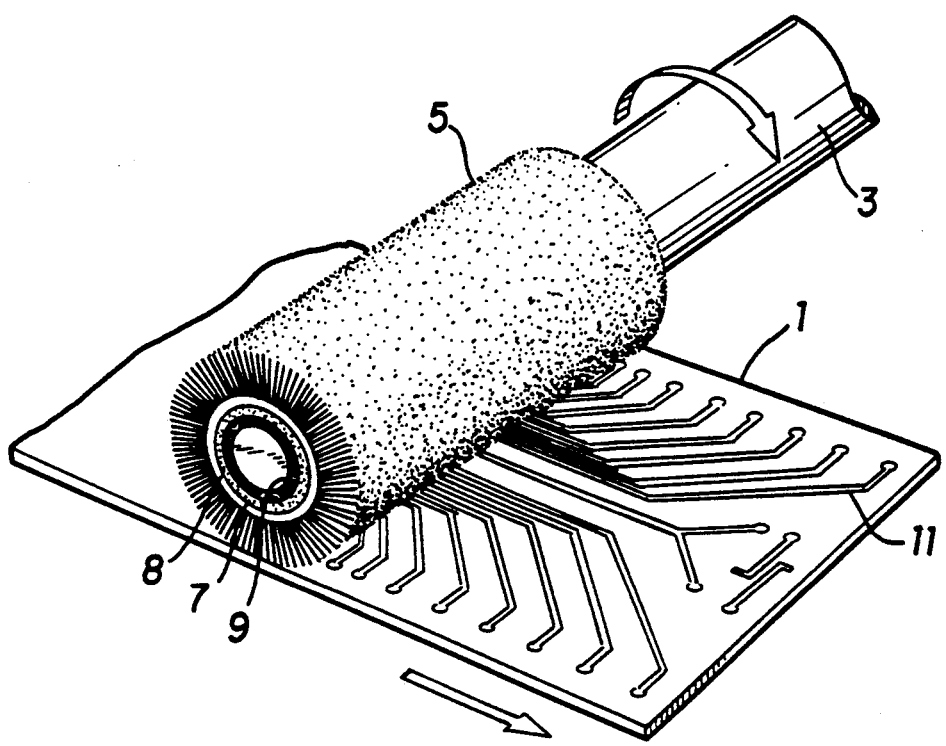
FIG. 1 is a perspective view of the brush of a first embodiment of the present invention in use over an imaged printed circuit board.

As shown in FIG. 1, a fiber brush 5 is employed in use over an imaged printed circuit board 1. The brush operates in a slowly rotating fashion at a peripheral velocity of between 0.1 and 100 centimeters per second. Fine metallic fibers of between 0.2 and 200 microns on the brush contact exposed copper areas and impose an electric field borne by the cylindrical brush design on the printed circuit board.

The fibers are in electrical contact with a perforated cylinder of the same material and represent the same electrode. This electrode is positive when the brush is being used as an etching device and is negative when the brush is used in an electroforming process.

Through the use of the brush, all of the exposed copper on the printed circuit board is dissolved by etching regardless of how the exposed copper is located in the desired pattern since the fibers of the brush come into contact with all areas on the board.

When employed in an electroforming mode, the printed circuit board has a negative photoresist pattern laid out on the board and the exposed lines are sensitized with the electroless activator. Following a brief electroless metallization step (if desired), the negatively charged brush deposits copper in a narrow line pattern faster and with greater uniformity than is obtained by the electroless process alone.

Figure 2:
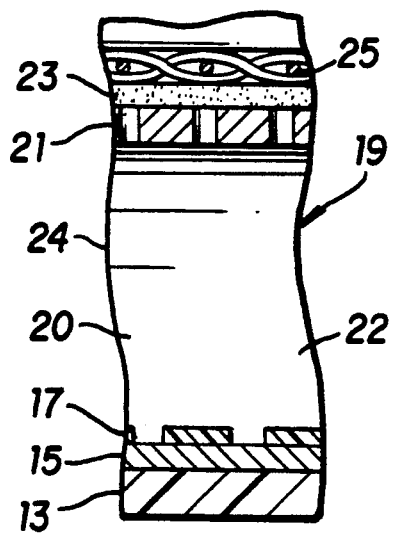
FIG. 2 is a side view of the brush of FIG. 1 employed as an etching device.
Figure 3:
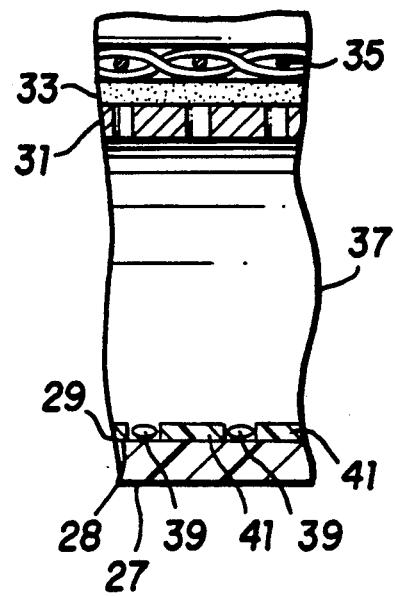
FIG. 3 is a side view of the brush of FIG. 1 employed as an electroforming device.

FIGS. 2 and 3 show the details of the brush functioning. Fibers are made of the following materials: tungsten, titanium, niobium, tantalum, graphite, platinum, rhodium and other insoluble but conductive materials like conductive ceramics, e.g., titanium oxides or, conductive plastic materials. The preferred materials are tungsten and titanium. The length of the fibers is defined by the flexibility as a function of thickness (e.g., 0.5 to 100 mm). The metallic cylinder is formed with perforations so that there is electrolytic communication to the interior of the brush cylinder. The counterelectrode, a mesh of insoluble metal, graphite or conductive ceramics when used as a cathode brush, or copper or stainless steel, when used as an anode brush, is separated from the brush via cylindrical porous separator 7. This separator, for example, may be formed of DARAMIC, sold by W. R. Grace Co. as an acid/lead battery separator.

An electric field is imposed between the electrodes by means of a power supply (DC or pulsating current). Slip rings 55 shown in FIG. 5 connect the power to the brush. Mechanical rotation is provided via a gear system which can be operated directly or via a belt type transfer from the motor.

In use, the material of the pattern is delineated with a photographic technique applied on a layer of an insulating photosensitive plastic material. This pattern material is typically 0.5–2 mils thick. Copper areas to be removed by etching ar exposed to the chemical action of liquids. These areas are also accessible to electrical contacts. In the course of the etching action, copper is removed until the insulating substrate becomes the only material present between the copper conductor lines formed in the etching process. In a fine line and fine space processing of the printed circuit board, the spaces formed by etching are 5 mils or less in width and 2–4 mils deep. The depth is a function of the film and copper sheet thickness.

Spaces designed as 2 mils or less in width are narrow gaps that are difficult to expose to any chemical or electrochemical action. The fiber brush of the present invention can now be employed. For example, ¼" fibers would have to penetrate only 2% of their length to reach the bottom of a 5-mil groove. This also requires a negligible bend on fibers which are not directly over the pattern at that instant. By providing a uniform pressure over the surface of the electronic device to be etched, and providing a uniformly fibrous material over the surface, etching of all areas that are exposed to the solution can be performed.

To provide some exchange of matter, and also to ensure that the etching proceeds preferentially in perpendicular direction to the plane of the device, a vibrator motion is provided parallel or perpendicular to its plane. Typically, motions of less than 5 cm at speeds of less than 5 cm/sec are sufficient to provide an electrolyte supply needed for exchange of matter and yet low enough to prevent excessive lateral dissolution.

If required, directions of motion parallel or perpendicular to the plane of the electronic device can be provided depending on the design for the pattern to be used and the manufacturing apparatus to be employed. Parallel types of motion are used for low relief devices where multiplicity and uniformity of contacts can be obtained by these motions.

When applying etching solutions like $FeCl_3$, $CuCl_2$, $NH_4S_2O_8$ or ammoniacal etchants, their chemical activity is sufficient to generate the etching effect of exposed copper. Thus, in such instances anodic current is not needed and the pattern formation can be achieved without electricity. Fibrous brushes with metallic or nonmetallic bristles can be used in this case. In addition to the above-described conductive fiber materials the following plastic fiber material can be applied: polyester, polyacrylate, polypropylene, polyethylene, polyvinyl, polystyrene, polyphenylene sulfide, ceramic fibers and other chemically resistive materials.

In the process of chemical etching, mechanical action of the fibers results in the etchant being supplied at the site of contact and saturated solution being removed from the same site with maximum efficiency. This action is a chemical drilling effect thus forming straight walls in the channels, to ensure good electrical performance of these conductors.

For PCB manufacturing, deposits of tin, tin-lead, nickel, gold or a nickel-tin alloy or palladium or a palladium-nickel alloy are also used as an etching resistant material in a film on top of the copper substrate to protect the substrate from chemical action of the etching solutions. While exposed copper is being dissolved, the above coatings are passive and as such, protect the underlaying copper from being dissolved.

FIG. 1 shows a perspective view of the fiber brush apparatus of one embodiment of the present invention utilized in combination with a printed circuit board. The printed circuit board 1 has various connecting lines and features 11 formed thereon. The lines and features 11 are enhanced, separated and formed by either an etching process or an electroformation process. Both processes may be employed utilizing fiber brush 5. The brush 5 is seen to be formed with a rotating handle 3 thereon coupled to the fiber brush head 5. The head is shown having three layers 7, 8, 9. Layer 7 is a separator layer, layer 9 is one electrode and layer 8 is the other electrode. Electrode 8 is coupled to the fibers of the brush head 5 as will be seen in further detail in connection with other figures discussed below.

FIG. 2 is a side view, partially in section, of the brush assembly of FIG. 1. In FIG. 2, the two electrodes are shown at numerals 25 and 21. The electrode 25 is formed of a metallic mesh. The two electrodes are separated by separator layer 23, which may be formed of an insulator (DARAMIC).

There is attached to electrode 21 a set of brush bristles 19. The brush bristles 20, 22, 24 are formed such that the brush bristles are all of equal length. As shown in FIG. 2, the bristles are in direct physical contact with a printed circuit board 13. Specifically, printed circuit board 13 has a layer of copper laminate 15 formed thereon and a layer of photoresist positive masking 17 formed on the copper laminate 15, all in the usual fashion. The mechanical and electrical contact of the bristles of the brush when voltage is applied to the electrodes and the brush is slowly rotated in the manner which will be described in further detail below serves to etch fine lines and details in the copper through the photoresist mask.

FIG. 3 is a view similar to that shown in FIG. 2 except that the bristles on the brush 37 are used in an electroforming process. Again, two electrodes 31 and 35 are shown having separator 3 formed therebetween. Coupled to the electrode 31 is a group of bristles in a brush 37. The printed circuit board substrate is shown at 27 having photoresist mask layer 29 formed thereon. A palladium/tin activator, for example, or a thin deposit of electroless copper is formed at 28 between the substrate 27 and the mask 29. Numerals 39 denote channels or valleys in the printed circuit board mask 29. Numeral 41 denotes the spacers between the channels 39. In this embodiment, the bristles in the brush head 37 serve to deposit metal in precisely formed and closely spaced channels 39 separated by separators 41.

Figure 4:
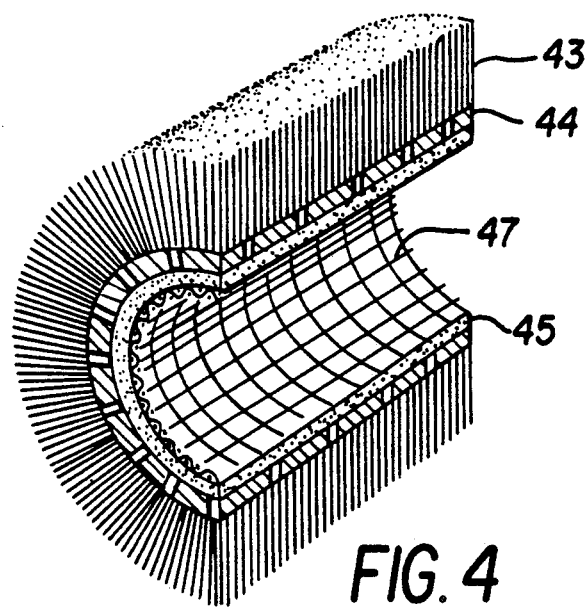
FIG. 4 is a sectional view of the brush of FIG. 1.

FIG. 4 is a view of the brush heads previously discussed, partially in section. In FIG. 4, a plurality of bristles 43 are coupled to a metallic fiber brush cylinder 44. This cylinder 44 serves as one of the electrodes. A porous separate 45 is coupled to the brush cylinder 44.

Another electrode 47 formed of mesh is connected to separator layer 45.

Figure 5:
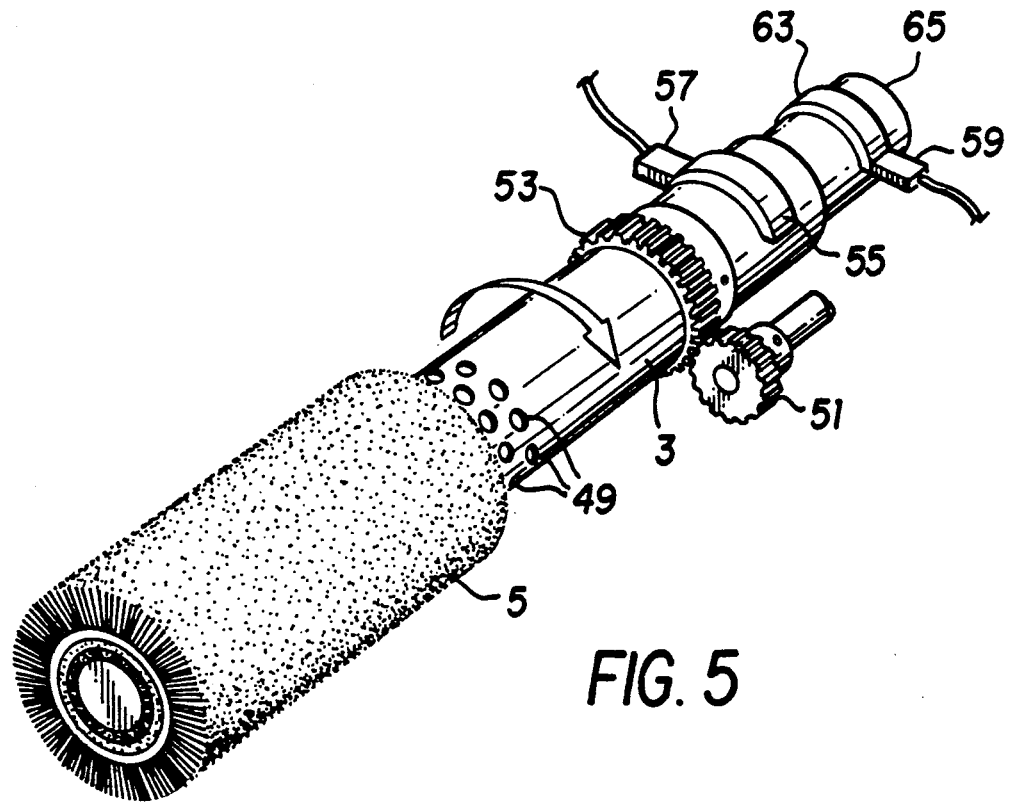
FIG. 5 is a side view of the assembly of the brush of FIG. 1.

In FIG. 5 shaft 3 is shown connected to a rotating mechanism and to a source of electrical power. More specifically, the brush head 5 is coupled to shaft 3 in the manner similar to the showing of FIG. 1. Numeral 49, on the handles of FIG. 3 denotes a plurality of apertures which serve to permit the flow of electrolyte therethrough. A ring gear arrangement 53, 51 is connected to the handle 53 and is provided to rotate same. Two slip ring electrode mechanisms 55, 57 and 59, 63 are connected to the handle and to the central core 65 formed within the handle. In this manner, power from electrodes 57, 61 is connected to the brush. The rotating ring assembly 51, 53 is provided to slowly rotate the brush over the surface of the printed circuit board.

Figure 6:
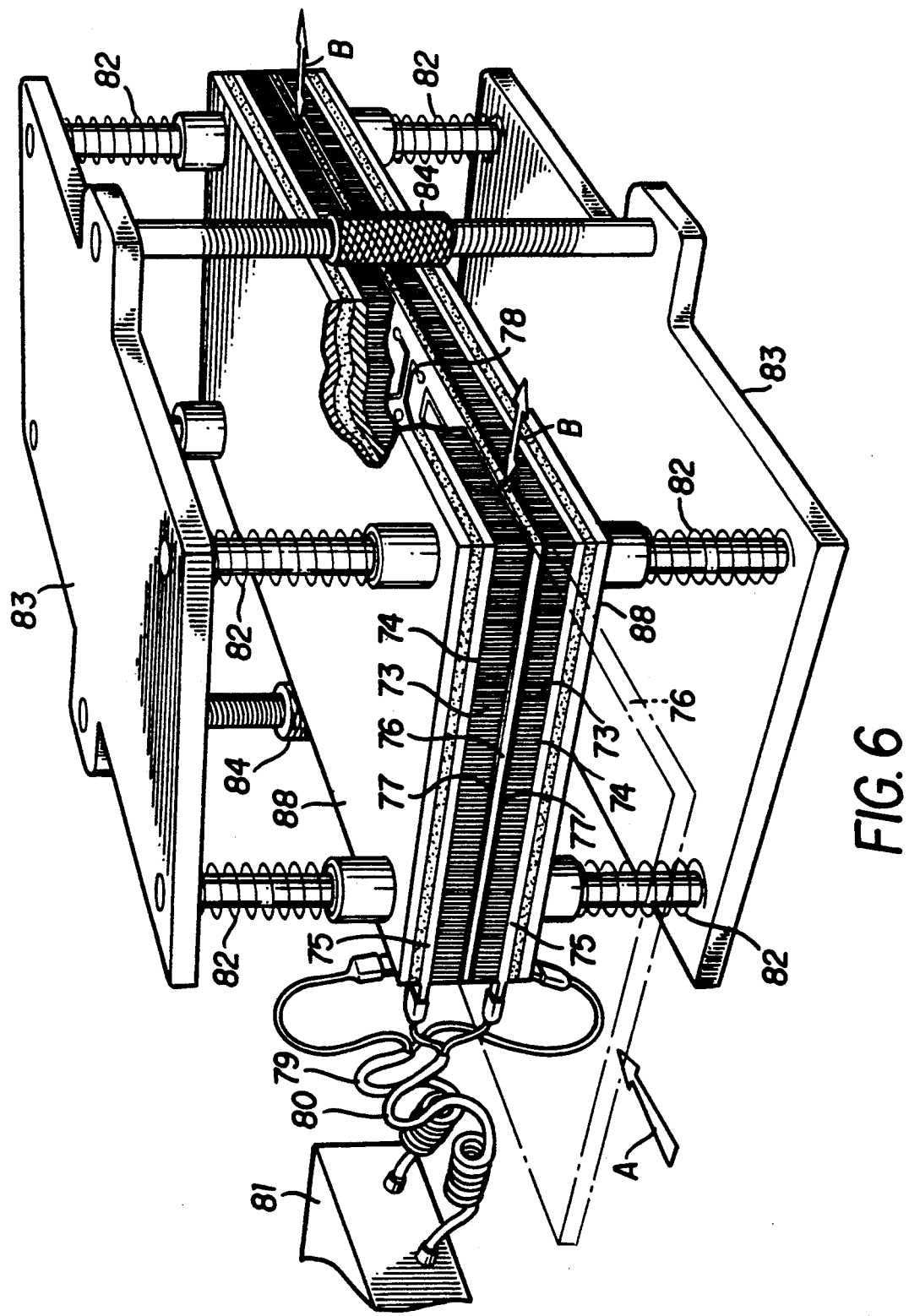
FIG. 6 is a perspective view of a flat brush according to a second embodiment of the present invention.

FIG. 6 shows a planar version of the apparatus. A plurality of bristles 63 are coupled to a foraminous substrate 65 by means of the backing material 64. Two such units sandwich a printed wiring board 66 which has two copper laminates 67 that are being etched (the example is given for the application of the apparatus for electrochemical etching of the board) to form the pattern 68. Electrical contact with the power supply 61 are made by means of the flexible contacts 69 and 600. One pole of the rectifier is attached to the foraminous substrate 65 which has the conductive junction to the backing material 64. The other pole of the rectifier is attached to the foraminous (perforated) counterelectrodes 688 to enable the generation of the electric field. In order to achieve a uniform effect over the entire board area a uniform pressure must be applied. This is achieved with counterimposed springs 622 with pressure adjusting device 644. Printed wiring boards are being slowly moved through the system indicated by arrow A. Lateral or perpendicular vibrations are provided by means of the mechanical or pneumatic action indicated by arrow B.

Figure 7:
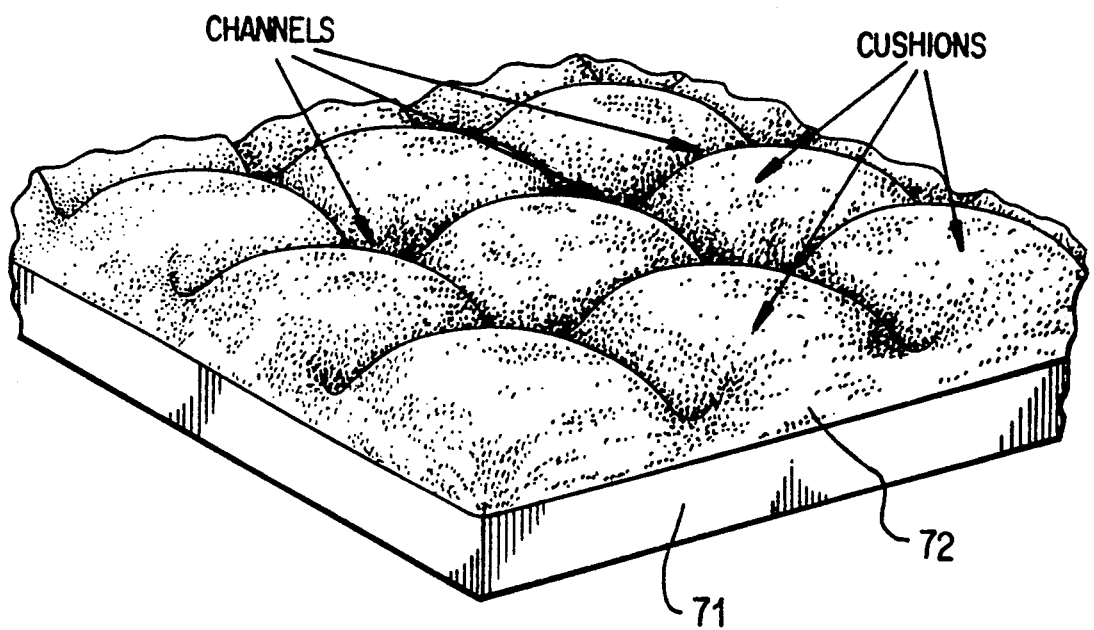
FIG. 7 illustrates a perspective view of a processing pad in accordance with a third embodiment of the present invention.
Figure 8A:
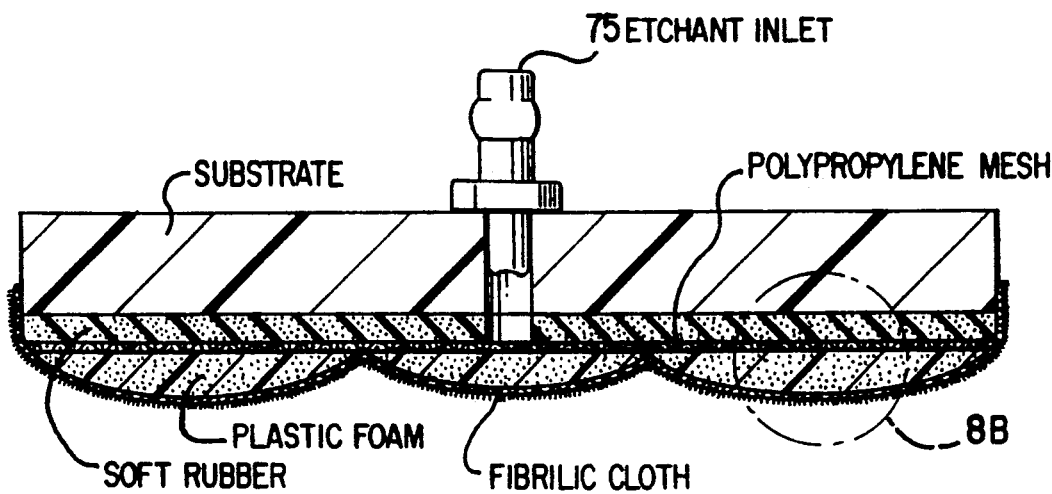
FIGS. 8A and 8B illustrate a cross-sectional view of the processing pad of FIG. 7.
Figure 8B:
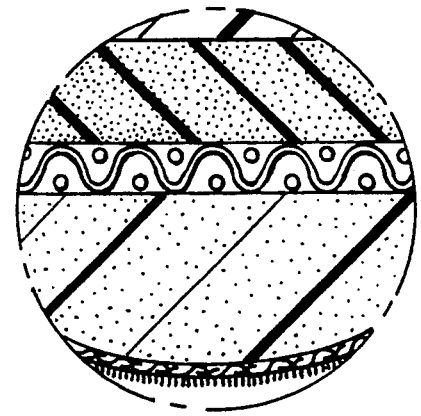
Figure 9:
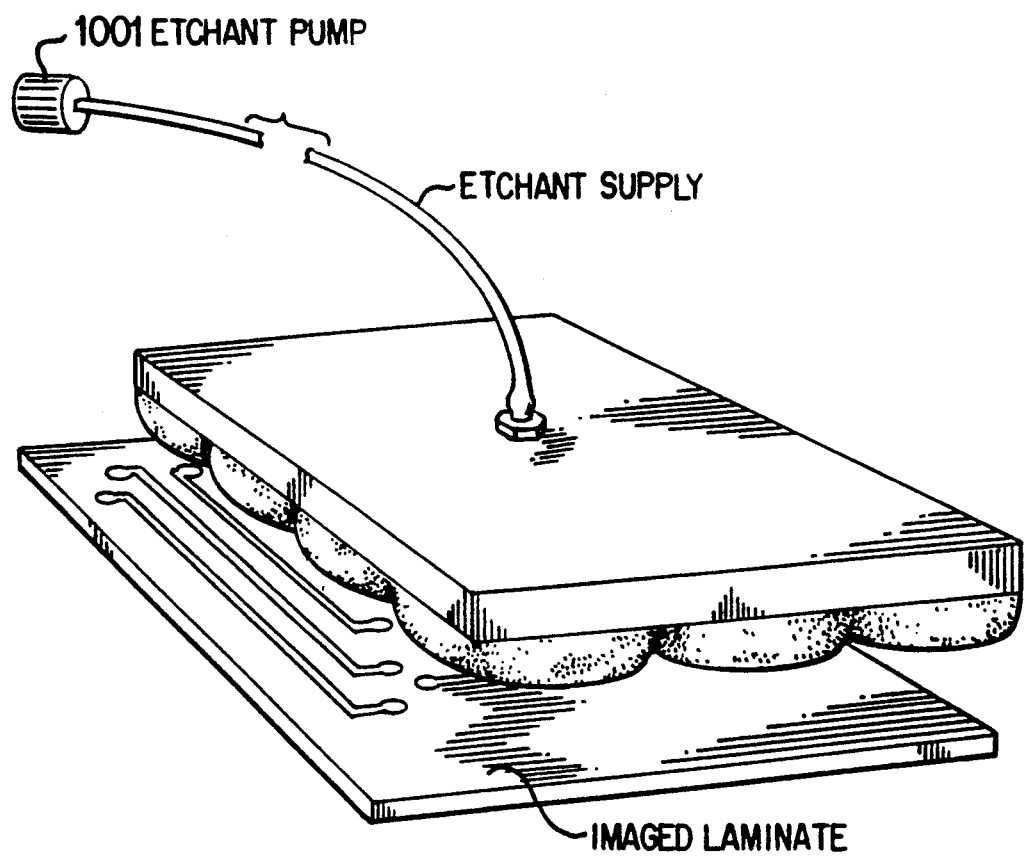
FIG. 9 illustrates a top view of the processing pad of FIGS. 7, 8A and 8B.

FIGS. 7 to 9 illustrate yet another embodiment of the processing pad of the present invention. This processing pad is intended to be operated in strictly a chemically etching capacity without electrochemical reaction. FIG. 7 illustrates a bottom view of the pad showing that portion of the pad which is to be in contact with the image of laminate to be brushed. A cloth/fiber configuration 72 is disposed on a substrate 71. The cloth/fiber configuration consists of a plurality of channels formed on the surface of the cloth so as to provide a quilted texture to the processing pad.

FIG. 8 illustrates a cross-section of the processing pad of FIG. 7. A polypropylene material can be used as the base for substrate of the pad. Etchant inlet valve 75 with a feed line portion 76 through the polypropylene base is provided so that chemical etchant material can be provided to the pad material. The etchant inlet valve is connected to an etchant pump 1001 that pumps etchant solution to the pad. A soft rubber material such as a silicone rubber is placed on the face of the polypropylene base. Polypropylene filter mesh is then added over the silicone rubber and is used to form a space for etchant distribution. A polyester velvet cloth is attached to a polyethlene foam which can be approximately one-quarter inch thick. The polyethlene foam is attached to the polypropylene filter to form a quilted structure. The polypropylene base material can be approximately one-half inch thick. To form quilted portions, stripes of glue are provided in such a manner so as to form sets of two perpendicular channels that are spaced 1.5 inches apart. The etchant inlet valve is provided in a centralized portion of the base so as to enhance distribution of the etchant material throughout the processing pad. Such a sheet can have an 8"×8" configuration.

Figure 10:
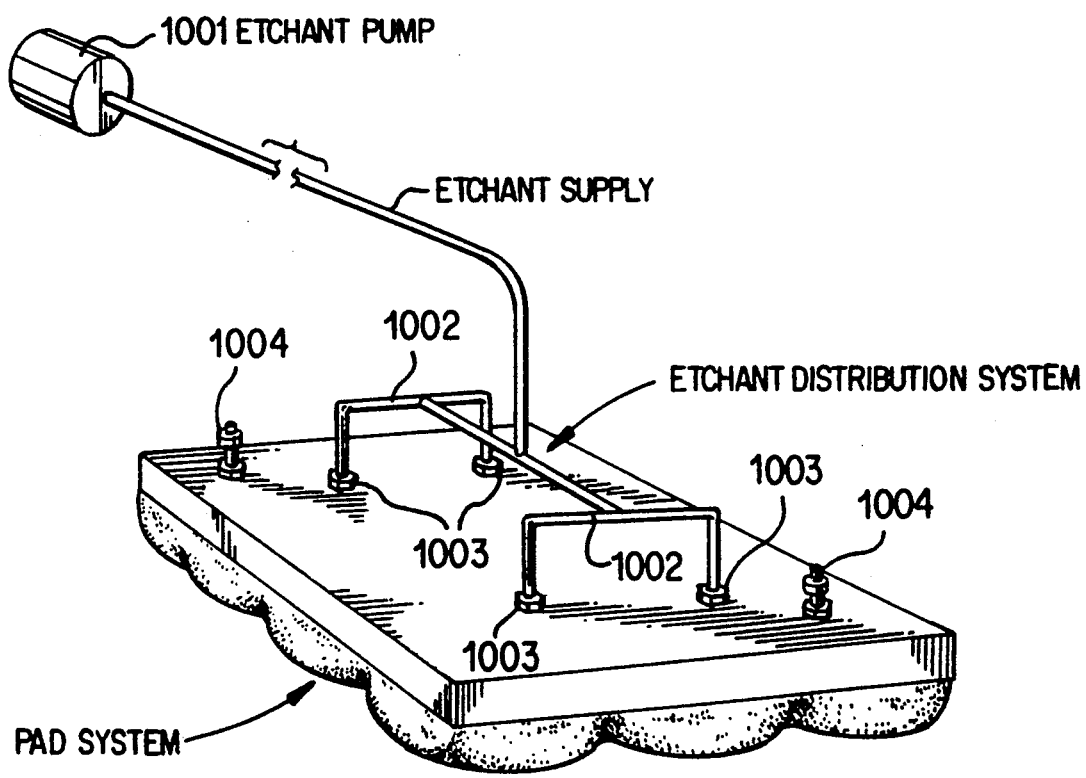
FIG. 10 illustrates a top view of a processing pad in accordance with a fourth embodiment of the present invention.
Figure 11:
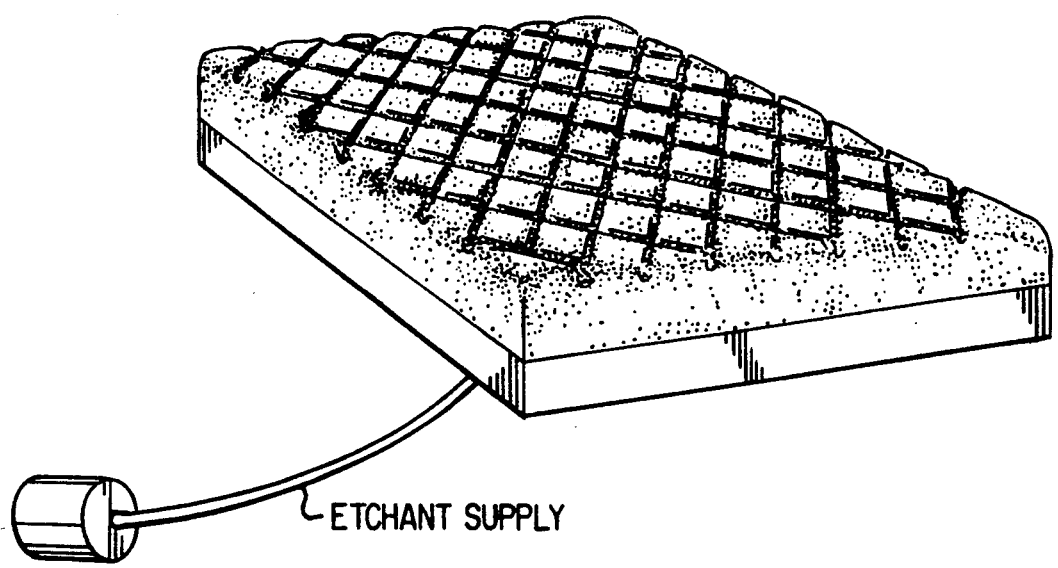
FIG. 11 illustrates a bottom view of the processing pad of FIG. 10.

FIGS. 10 and 11 illustrate yet another embodiment of the present invention which constitutes a variation of the embodiment of FIGS. 7 to 9. In this next embodiment, a similar pad configuration can be provided on an 8"×8" polypropylene base. The difference is in the provision of the chemical etchant. The etchant is still supplied by a pump 1001. However, in place of the single etchant inlet valve 75 of FIGS. 8 and 9, the embodiment of FIG. 10 utilizes an etchant distribution system which includes a plurality of etchant feed lines 1002 provided to a plurality of etchant inlet valves 1003 disposed in a symmetrical pattern along the base of the pad system. In addition, two vents 1004 are provided and are also symmetrically disposed on this back portion of the base. This configuration further enhances the uniformity of the etchant distribution. Another modification of the embodiment of FIGS. 7 to 9, shown in the embodiment of FIGS. 10 and 11, relates to the quilting texture of the processing pad. In the embodiment of FIGS. 10 and 11, the quilted structure is formed by stitching the fibrilic cloth to the polypropylene filter material with polyethylene foam disposed between the two materials. This enhanced configuration for uniform etchant distribution permits expansion of the size of the flat brush to 15"×15" with the thickness of the polypropylene base being extended to ¾".

Figure 12:
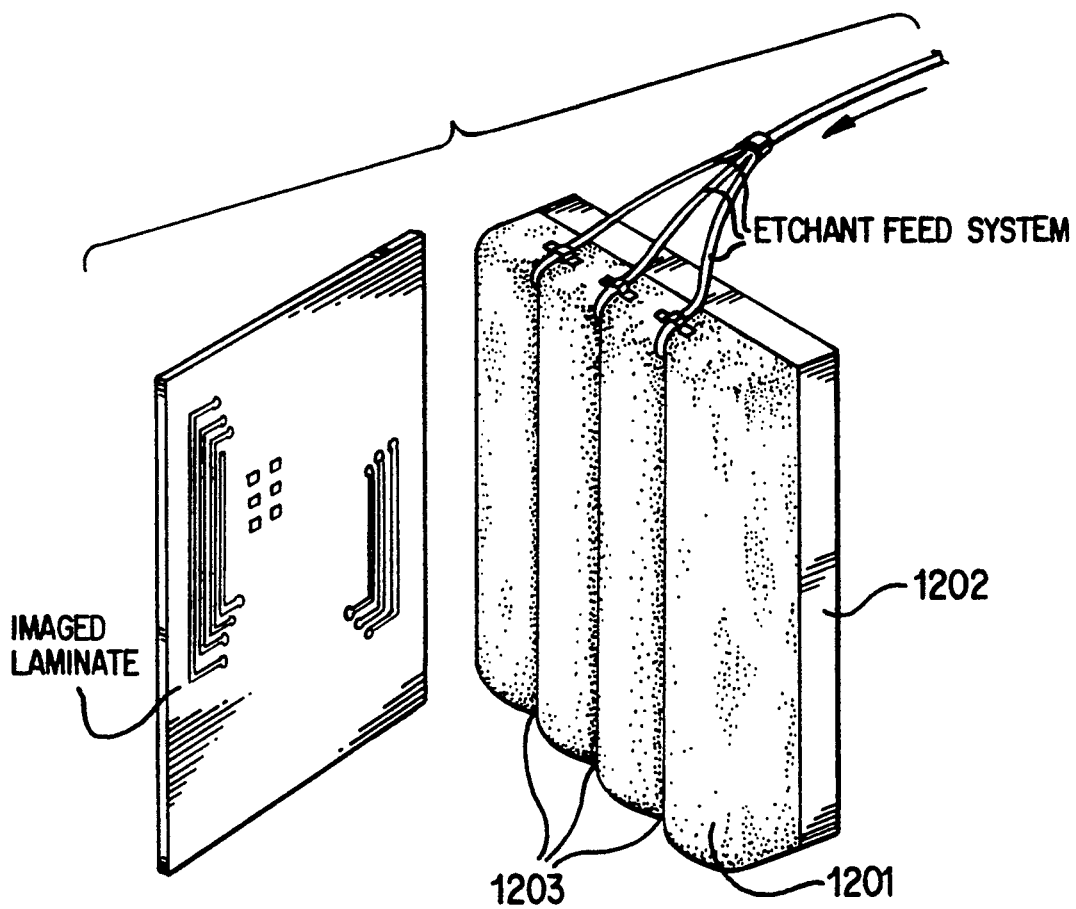
FIG. 12 illustrates a perspective view of a processing pad in accordance with a fifth embodiment of the present invention.

FIG. 12 illustrates yet another embodiment of the present invention. In this embodiment, a flat brush is provided for vertical etching and has a side feed for the chemical etchant. In this configuration, a pad 1201 is formed over a 10"×10"×1" polypropylene piece 1202. Five parallel 1.5 inch spaced lines 1203 are formed by stitching grooves into the velvet pads. The entire construction is held in a vertical position during etching so that the grooves run from the top of the device to the bottom of the device. On top of the pad, at positions corresponding to each groove on the pad, an etchant distribution plastic tube 1204 is affixed to supply the liquid into the corresponding groove while etching.

Figure 13A:
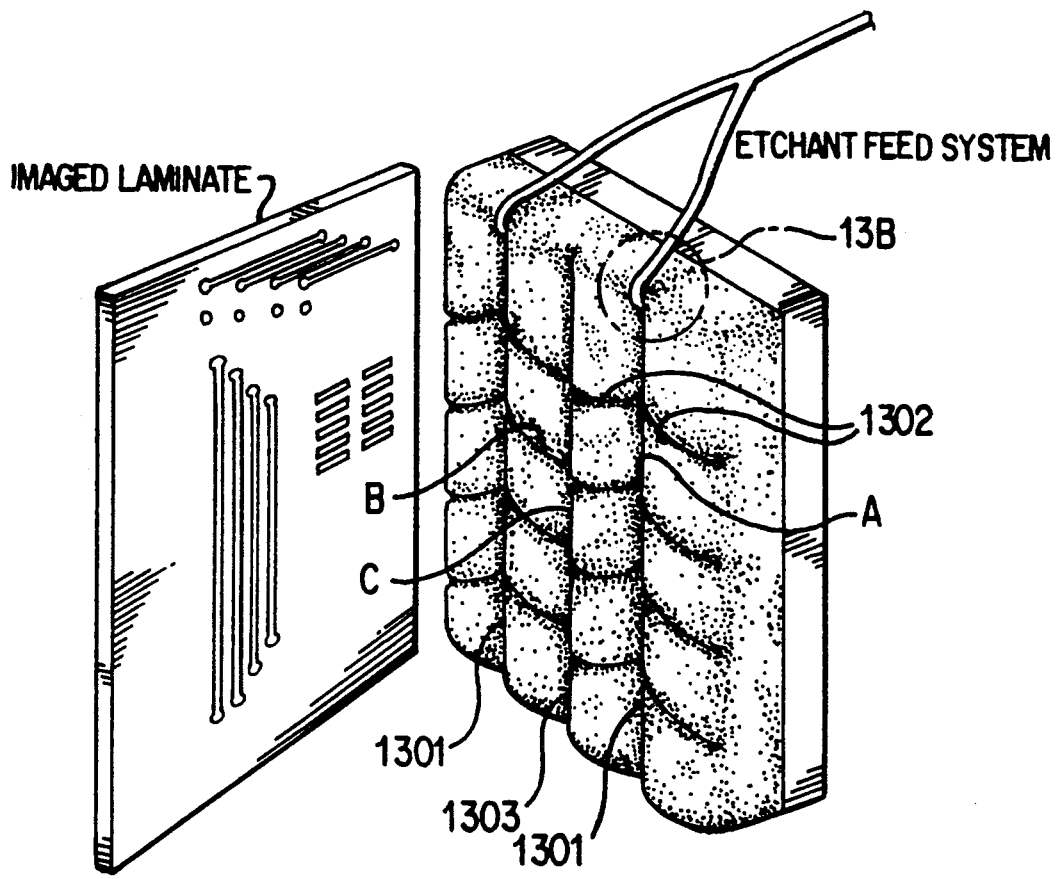
FIGS. 13A and 13B illustrates a perspective view of a processing pad in accordance with a sixth embodiment of the present invention.
Figure 13B:
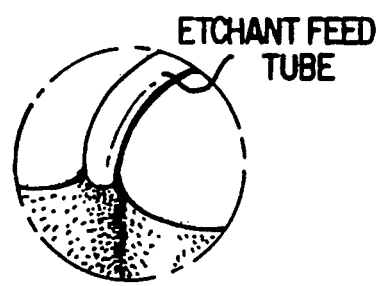

FIG. 13 illustrates yet another embodiment of the present invention, which is in part a variation on the embodiment of FIG. 12. This embodiment is also used for vertical etching and provides a different distribution system so as to increase the surface area of the vertical processing pad. In this instance, the pad may be 15"×15" with a groove construction which is different from that of the embodiment of FIG. 12. In particular, there are a plurality of types of channels 1301, 1302 and 1303. Channels 1301 are main feed grooves. Atop the processing pad, in positions corresponding to these feed grooves 1301 are etchant feed tubes 1304. The etchant is provided to flow down through the main feed grooves 1301. Furthermore, a system of short, slanted, channels 1302 acts as a system of tributaries to the main drainage system formed by side grooves 1303. Such a system of supply and drainage provides a uniform distribution of etchant thereby enhancing the etching efficiency of the vertical etching technique.

EXAMPLE 1

Electrochemical Pattern Etching by Means of Ti Fibers-Cylinder

Titanium fibers 22 microns in diameter (Bekaert, Bekinox VN 22/2×275 200/TI) were attached to a titanium cylinder 2" in diameter. Fiber bundles were ¼" long and were located between perforations in the cylinder wall as depicted in the attached FIG. 1. Interior portion of the cylinder was covered with "Daramic" spacer, a porous plastic used in acid batteries as a separator. The innermost position in the cylinder was occupied with a copper mesh as a counterelectrode. In contacting a PCB submerged in a solution of copper sulfate, 1.5M $CuSO_4$ plus 0.4M $H_2SO_4$, a field was generated between the copper sheet of the laminate and the inner copper mesh, positive pole of the field being the copper of the PCB and negative being the mesh. Under such conditions, all copper of the PCB in contact with the titanium fibers was dissolved while an equivalent amount of copper was deposited on the copper mesh. This was possible since titanium passivates in such conditions thus becoming electrochemically inert yet being capable of transporting the positive charge. A sample pattern was formed under such conditions after 15 minutes of DC current density of approximately 1 amp/in2. A good resolution of 2 mil lines and spaces was obtained in 1.4 mil copper laminate over an FR-substrate.

EXAMPLE 2

Electrochemical Pattern Etching by Means of Ti Fibers—Flat Brush

Titanium fibers, same as above Example 1, were used to fabricate a flat fiber brush (FIG. 6). A perforated titanium sheet was used as current collector for Ti fibers. The apparatus operated as a flat paint brush soaked with electrolyte. A sheet of "Daramic" separator was used between the counterelectrode mesh and the fibrous electrode. With a rotating motion of 1-2 r.p.s. and in circles of 2-3 mm in diameter, a pattern of lines 4 mils in thickness was obtained in 10 minutes with an approximate DC of 1 amp/in$^2$. Copper laminate was of a thickness of 1.4 mil on FR-4 substrate. Solution was used in this example was $CuCl_2$, 35° Be at room temperature.

EXAMPLE 3

Chemical Pattern Etching by Means of Titanium Fibers—Flat Brush

Titanium fiber brush, FIG. 2, was used in a chemical etching process with $FeCl_3$ 42° Be at room temperature. In a similar motion as described in Example 2, a good resolution of a pattern of lines 4 mil in thickness was obtained in 10 minutes on 1 oz. copper laminate over 10 mil polyamide substrate.

EXAMPLE 4

Chemical Pattern Etching by Means of Pile Fabrics (Velvet)—Flat Brush

Commercially available acrylic pile fabric, 2 mm thick, made with 300 denier threads containing 50 filaments, was used as the brush for etch pattern formation. In a five minute duration using $FeCl_3$ solution, a uniform well-defined resolution was obtained with 1 mil lines and 3 mils spaces in a 0.7 mil copper laminate.

EXAMPLE 5

Chemical Pattern Etching by Means of Pile Fabrics (Velvet)—Flat Brush

Commercially available polyester velvet, 2 mm thick, was used as the brush for etch pattern formation. A 2 oz. copper laminate over polyamide substrate was used to form patterns of 4 ml lines and 4 mil spaces. With $FeCl_3$ as etchant in 10 minutes, with rotating motion of the brush, a well-defined pattern was obtained.

EXAMPLE 6

8"×8" Flat Brush Construction and Test

The 8"×8" construction illustrated in FIGS. 7 to 9 was used. The polypropylene base material was ¼" thick and the polyester velvet cloth was attached to a polyethylene foam ¼" thick. The quilted structure included two sets of two perpendicular channels that were spaced 1.5 inches apart. Etching was performed for 1 oz/sf copper laminate to form 2.4 mil lines and 2.86 mil spaces.

A high density circuit was formed over a double-sided inner layer 1 oz/sf copper having a final dimension of 5"×5". A two-sided, low profile laminate with a 2 mil insulating layer was imaged with a high density pattern. The high image had 2.5 mil lines and 2.5 mil spaces, and 4 mil and 10 mil spaces. 8 mil octagonal pads were provided for the 2.5 mil lines.

A pressure of 10 lbs/sf and an amplitude of horizontal motion of two inches at a frequency of 1 Hz was applied to the workpiece. After 75 seconds exposure to the processing unit, a pattern was formed on the laminate with an average undercut on each side of the line 0.18 mils plus +/−0.05 mils at the line footing and 0.5 mils +/−0.08 mils on top of the lines. The resulting space was 2.86 +/−0.05 mils with lines of 2.14 +/−0.05 mils. Four mil line images resulted in 3.8 +/−0.05 mil copper lines. The chemical and brush processing parameters are as follows:

| | |
|---|---|
| Etchant: | $CuCl_2$ |
| HCL: | 1N |
| Oxidation/Reduction Potential (ORP): | 620 mV |
| Density g/ccm: | 1.42 (25° C.). |
| Temperature: | 135° F. |
| Flow Rate: | 150 ml/min. |
| Amplitude: | 1 inch. |
| Frequency: | 2 Hz. |
| Weight: | 1.2 lbs. |

EXAMPLE 7

8"×8" Flat Brush Test

In this example, the brush construction was the same as that for Example 6. However, etching was performed with ½ oz/sf copper laminate to form 2.30 mil lines and 2.70 mil spaces.

A high density circuit was formed over a double-sided inner layer ½ oz/sf copper with final dimensions being 5"×5". The two-sided low profile laminate with a 2 mil insulating layer was imaged with a high density pattern. The image had 2.5 mil lines and 2.5 mil spaces as well as 4 mil lines and 10 mil spaces. The 2.5 mil lines had 8 mil octagonal pads.

A pressure of 5 lbs/sf, an amplitude of 1" at a frequency of ½ Hz was applied to the workpiece. After 40 seconds exposure to the processing unit, a pattern was formed with an average undercut on each side of the line 0.10 mils +/−0.05 mils at the line footing and 0.3 mils +/−0.08 mils on the top of lines. The resulting space was 2.70 +/−0.05 mils with lines of 2.30 +/−0.05 mils. Four mil line images resulted in 3.90 +/−0.05 mil copper lines. The chemical and brush processing parameters were the same as in Example 6.

EXAMPLE 8

15"×15" Flat Brush Construction and Test

In this example, a brush having the construction of FIGS. 10 and 11 was utilized. In particular, a 15"×15" CPVC ¾" stock material was used in machining the processing unit. Etchant feed lines were introduced in a symmetrical pattern 4" apart centered in the middle of the unit as depicted in FIGS. 10 and 11. Vents were introduced also symmetrically 4" apart. The inner construction of the pad was similar to that of Examples 6 and 7. However, in this case, the quilted structure was formed by stitching the fibrilic cloth to a polypropylene filter material with polyethylene foam disposed between the two materials. This resulted in a structure combining 50 2"×2" padded cushions with a network of channels formed between them. While the cushions performed the etching activity, the channels distributed the liquid with the uniform steady state etchant composition across the entire area to be etched.

A high density circuit was formed on a double-sided inner layer 1 oz/sf copper laminate with a final dimension of 8"×12". A two-sided, low profile laminate with a 10 mil insulating layer was imaged with a high density image. The image had four groups of six patterns. Each pattern had 240 inches of 3.8 mil lines and 2.2 mil spaces. Test pads were formed on each pattern for continuity testing.

A pressure of 7 lbs/sf and an amplitude of two inches at a frequency of 2 Hz was applied to the workpiece. After 80 seconds of exposure to the processing unit, a pattern was formed with an average undercut on each side of 0.30 +/−0.05 mils at the line footing and 0.40 +/−0.06 mils on top of the lines. Thus, with 1:14 ratio of line width on top over the line thickness, the resulting side walls were nearly vertical, indicating an important advantage of this processing. The chemical processing and brush processing parameters were as follows:

| | |
|---|---|
| Etchant: | $CuCl_2$ |
| HCL: | 1N |
| Oxidation/Reduction Potential (ORP): | 640 mV |
| Density g/ccm: | 1.42 (25° C.) |
| Temperature: | 130° F. |
| Flow Rate: | 250 mL/min. |
| Amplitude: | 1 inch. |
| Frequency: | 2 Hz. |
| Weight: | 12 lbs. |

EXAMPLE 9

15"×15" Flat Brush Test

The brush structure and etchant for Example 9 were the same as that for Example 8. In this example, a high density circuit was imaged on a double-sided board of the final size of 10"×15". A tent and etch pattern with pattern density with four traces between the pads was formed on the laminates. Imaged traces had 5.5 mil width with typical space of 4.5 mils between the lines. After 200 seconds of exposure to the 15"×15" unit, a uniform circuit was obtained with nearly vertical walls, 78 +/−5° and line width of 4.2 +/−0.4 mils.

EXAMPLE 10

15"×15" Flat Brush Test

The brush structure was the same as in Example 8, with the exception of using a higher density quilt. In this example, the size of the cushions was 1"×1". The image was a test pattern of parallel traces two to fifteen mils, eighty inches long repeated in four groups over a 10"×10" laminate. The laminate was a 1 oz, two-sided copper material.

The pressure applied was 8 lbs/sf with an amplitude of 1.5 inches and a frequency 1 Hz. In 85 seconds of exposure, the resulting high quality pattern had 80° walls, smooth lines and a uniform 0.25 mils undercut. With an electric tester, the continuity of the traces was confirmed across the board.

EXAMPLE 11

10"×10" Flat Brush for Vertical Etching with Side Feed

This example utilizes the processing pad of FIG. 12. With this pad a vertical etching of one ounce laminate forming three to six mil traces on a 9"×9" test pattern was performed.

The pad was formed over a 10"×10"×1" polypropylene piece. Five parallel 1.5" spaced lines were formed by stitching grooves into the velvet pads. The pad was held vertical during etching. On top of the pad at positions corresponding to each groove, an etchant distribution plastic tube supplied liquid etchant into the groove while etching.

A pressure of 5 lbs/sf and a horizontal motion amplitude of 2" at a frequency of 2 Hz were applied to the workpiece. The etchant was the same as Example 6 and was uniformly distributed across the entire board. This achieved, with the synergistic action of the grooves acting as irrigation system and the motion of the pad acting as horizontal transport system, uniform etchant distribution across the entire board. In 75 seconds exposure to the processing unit, a high quality pattern was formed. The average undercut was 0.25 mils. Uniformity was comparable to either of the horizontal systems.

EXAMPLE 12

15"×15" Flat Brush for Vertical Etching with Feed Across the Pad with Drainage System This example was performed using the embodiment of the present invention illustrated in FIG. 13. Using this pad, vertical etching of a 1 oz. laminate to form 3, 4, 5, and 6 mil traces on a 12"×12" test pattern was performed. The grooves provided in the padding configuration were formed by stitching across the pad face. Grooves of type A were used for receiving etchant from a perforated teflon tubing which supplied etchant to the interface. The system of short slanted channels B acted as a system of tributaries to the main drainage system C. With such system of supply and drainage, a uniform etchant distribution and efficiency were achieved in vertical etching.

Pressure of 4 lbs/sf and 2" amplitude at a frequency of 2 Hz were applied to the workpiece. Acid cupric chloride etchant was used in processing the boards. In 85 seconds, the etching was accomplished, forming a high density pattern with an undercut with 25 mils on average. The uniformity of etching was comparable to that obtained with either of the horizontal systems.

EXAMPLE 13

15"×15" Flat Brush Application for Horizontal Etching with Commercial Alkyline Etch In this example, the embodiment illustrated in FIGS. 10 and 11 was utilized in a horizontal patterning operation. In particular, the etching of 3 mil copper laminate with solder etch resist SMT pattern was performed.

A commercially available alkaline etchant was used in forming a 5 mil pattern for a series of surface mount boards. The 15"×15" flat brush of Example 10 was used for etching. The pressure applied was 8 lbs/sf, with an amplitude of 1.5 inches and a frequency of 1 Hz. A uniform pattern was obtained in 280 seconds. The average undercut was 1.05 mils resulting in nearly vertically smooth finished walls.

EXAMPLE 14

Examples 6 to 13 demonstrate the performance of the brush applicator of the present invention. However, in these examples, the panel to be operated on was attached to the substrate with a tape. In practice, a production line must operate in a continuous manner meaning that tape attachment may be prohibitive. The process has been modified so it can be conducted at a continuous rate by introducing the following changes:
 a) providing a moving table-substrate;
 b) providing a gasket (neoprene or silicone rubber) to provide frictional retention at the panel/table interface;
 c) providing "used-out" or spent etchant (ORP 300 mV for cuperic chloride or 26 ounce Cu/gal for alkaline etchant) for etch prevention on the side of the table.

The moving table-substrate provides continuity in supplying the panels to be etched. The speed of the table motion is adjusted to the rate of etching. For example, for a 1 oz. Cu, the speed is adjusted to 1 ft/min for a 1 foot long pad since the etching speed is on the order of 1 oz/min (1.4 mils/minute).

The gasket provides a cushion for the panel image. It also acts as a friction device for the one side during the etching process. While the pad has a continuous etchant liquid supply between the panel and the brush applicator which acts as a lubricant, the other side facing the rubber gasket is coated only with spent etchant initially. As the panel enters the etching brush section, excess of this spent etchant is squeezed out so that the rubber holds the panel in place, attached to the moving table. Since this etchant has no etching capability, while it covers exposed copper and is not removed by the brush it prevents etching until the panel is flipped over to be etched on that side.

It has also been determined that additives like trimethylammonium chloride have beneficial effect on apparatus performance. Since this additive is a surfactant, it helps in lubricating the applicator motion. In addition, it has copper corrosion inhibitive activity so that the extent of undercut is reduced. This type of additive cannot be used in conventional spray etching systems since it causes foaming which is prohibitive in spray equipment. We have also determined that alkaline etchant with this additive can be regenerated in commercial ion-exchange regeneration systems, for example, by using Lix-54 regenerant.

A 15"×15" flat brush application with modified commercial alkaline etch was performed to etch a 3 mil copper laminate with solder etch-resist SMT pattern. A commercially available alkaline etchant with 17-19 oz. copper/GAL of solution was modified by adding dodecyltrimethyl ammonium chloride in quantities of 10-50 ppM. This modified etchant was used in forming a 5 mil pattern for a series of surface mount boards. The 15"×15" flat brush of Example 10 was used for etching over a moving table. The spent etchant with 26 oz Cu/gal was used to coat the side facing the moving table. The pressure of 8 lbs/sf, amplitude 1.5 inches, and frequency of 1 Hz were applied. A uniform pattern was obtained in 280 seconds. The average undercut was 0.95 mils, resulting in nearly vertically smooth finished walls.

Two sides of the board had identical results indicating that spent etchant prevented over etching of the side of the board facing the table.

Other additives of the same generic origin are between 8 to 11 carbon alifatic chain and any of these can have trymetylammonium salts of chloride bromide or sulfate.

In all examples given, the mechanical action was uniform, and the area exposed to such mechanical action was uniformly etched as a consequence.

As modifications to the foregoing may be made without departing from the spirit and scope of the present invention, what is sought to be protected is set forth in the appended claims.

What is claimed is:

1. An apparatus for producing fine line interconnects with fine line spacings comprising:
 a substrate;
 a chemical etchant filter system connected to a face of said substrate; and
 a pad structure provided over said chemical etchant filter system.

2. The apparatus of claim 1 wherein said pad structure comprises a fibrilic cloth disposed on a plastic foam.

3. The apparatus of claim 2 wherein said cloth has a quilted texture configuration, providing a plurality of channels along the face of the cloth to come into contact with an element to be processed.

4. The apparatus of claim 1 further comprising an etchant distribution system supplying chemical etchant to said filter through said substrate.

5. The apparatus of claim 4 wherein said etchant distribution system comprises an etchant pump and an etchant inlet, connected to said etchant pump, and disposed in a central portion of said substrate.

6. The apparatus of claim 4 wherein said etchant distribution system comprises an etchant pump, a plurality of etchant inlets, distributed along a back surface of said substrate and connected to said etchant pump, and a plurality of vents disposed along a back surface of said substrate.

7. The apparatus of claim 1, wherein said pad structure includes a plurality of parallel grooves extending along a first direction across a face of the pad structure, and further comprising a plurality of etchant supply lines, one provided for each of said plurality of parallel grooves and positioned at one end of said groove to supply etchant with a uniform distribution along each groove.

8. The apparatus of claim 1 wherein said pad structure includes:

a plurality of main channels extending in parallel along a first direction across a face of said pad structure;

a drain channel extending parallel to said main channels; and a plurality of tributary channels each intersecting at least one main channel and said drain channel;

and said apparatus further comprising an etchant distribution system including supply tubes coupled to said main channels.

* * * * *

UNITED STATES PATENT AND TRADEMARK OFFICE
CERTIFICATE OF CORRECTION

PATENT NO. : 5,167,747
DATED : December 1, 1992
INVENTOR(S) : Igor V. Kadija

It is certified that error appears in the above-indentified patent and that said Letters Patent is hereby corrected as shown below:

| Column | Line | |
|---|---|---|
| 7 | 17 | Change "ar" to --are--. |
| 15 | 2 | After "undercut" change "with 25" to --width of .25--. |

Signed and Sealed this

Twenty-first Day of December, 1993

Attest:

BRUCE LEHMAN

*Attesting Officer*     *Commissioner of Patents and Trademarks*